(12) United States Patent
Duesman et al.

(10) Patent No.: US 10,867,991 B2
(45) Date of Patent: Dec. 15, 2020

(54) SEMICONDUCTOR DEVICES WITH PACKAGE-LEVEL CONFIGURABILITY

(71) Applicant: Micron Technology, Inc., Boise, ID (US)

(72) Inventors: Kevin G. Duesman, Boise, ID (US); James E. Davis, Meridian, ID (US); Warren L. Boyer, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/234,208

(22) Filed: Dec. 27, 2018

(65) Prior Publication Data

US 2020/0212032 A1    Jul. 2, 2020

(51) Int. Cl.
| | | |
|---|---|---|
| *H01L 27/02* | (2006.01) | |
| *H01L 21/48* | (2006.01) | |
| *H01L 23/49* | (2006.01) | |
| *H01L 23/00* | (2006.01) | |
| *H01L 23/498* | (2006.01) | |

(52) U.S. Cl.
CPC ...... *H01L 27/0292* (2013.01); *H01L 21/4853* (2013.01); *H01L 23/49838* (2013.01); *H01L 24/16* (2013.01); *H01L 2224/16227* (2013.01); *H01L 2924/1426* (2013.01); *H01L 2924/14511* (2013.01); *H01L 2924/30205* (2013.01)

(58) Field of Classification Search
CPC ............. H01L 27/0292; H01L 21/4853; H01L 23/49838; H01L 24/16
USPC ....................................................... 257/355
See application file for complete search history.

(56) References Cited

U.S. PATENT DOCUMENTS

| | | | |
|---|---|---|---|
| 5,945,713 A | * | 8/1999 | Voldman ............. H01L 27/0251 257/355 |
| 6,342,724 B1 | | 1/2002 | Wark et al. |
| 9,711,500 B1 | | 7/2017 | Walker |
| 10,128,229 B1 | * | 11/2018 | Davis .................. H01L 27/0288 |
| 10,283,462 B1 | | 5/2019 | Davis et al. |
| 10,312,232 B1 | | 6/2019 | Davis et al. |
| 10,483,241 B1 | * | 11/2019 | Duesman ................ H01L 24/05 |

(Continued)

FOREIGN PATENT DOCUMENTS

| | | |
|---|---|---|
| CN | 1905178 B | 9/2010 |
| JP | 2006135302 A | 5/2006 |

(Continued)

OTHER PUBLICATIONS

TW Patent Application No. 107136282—Taiwanese Office Action and Search Report, dated May 6, 2019, with English Translation, 14 pages.

(Continued)

*Primary Examiner* — Sheikh Maruf
(74) *Attorney, Agent, or Firm* — Perkins Coie LLP

(57) ABSTRACT

A semiconductor device assembly includes a substrate and a die coupled to the substrate. The die includes a first contact pad electrically coupled to a first circuit on the die including at least one active circuit element and a second contact pad electrically coupled to a second circuit on the die including only passive circuit elements. The substrate includes a substrate contact electrically coupled to the first contact pad, and the substrate is electrically isolated from the second contact pad.

19 Claims, 6 Drawing Sheets

(56) References Cited

U.S. PATENT DOCUMENTS

| | | | |
|---|---|---|---|
| 2002/0043712 A1* | 4/2002 | Efland | H01L 23/3171 257/691 |
| 2002/0084490 A1* | 7/2002 | Ker | H01L 27/0292 257/355 |
| 2002/0130390 A1* | 9/2002 | Ker | H01L 27/0255 257/546 |
| 2002/0153571 A1* | 10/2002 | Mergens | H01L 27/0262 257/358 |
| 2003/0116806 A1* | 6/2003 | Kato | H01L 27/0251 257/357 |
| 2003/0127704 A1 | 7/2003 | Kobayashi et al. | |
| 2003/0173623 A1* | 9/2003 | Takemura | H01L 27/0292 257/355 |
| 2004/0016970 A1* | 1/2004 | Chen | H01L 27/0251 257/355 |
| 2004/0140860 A1 | 7/2004 | Miller | |
| 2004/0212083 A1 | 10/2004 | Yang | |
| 2006/0001101 A1* | 1/2006 | Hirata | H01L 27/0251 257/355 |
| 2006/0071320 A1 | 4/2006 | Shibata et al. | |
| 2007/0085144 A1* | 4/2007 | Chen | H01L 27/0292 257/362 |
| 2007/0117266 A1 | 5/2007 | Ball | |
| 2009/0278245 A1 | 11/2009 | Bonifield et al. | |
| 2009/0321954 A1* | 12/2009 | Oh | H01L 24/24 257/777 |
| 2011/0018129 A1* | 1/2011 | Suzuki | G02F 1/13452 257/737 |
| 2012/0068306 A1 | 3/2012 | Song et al. | |
| 2012/0319228 A1* | 12/2012 | Ishihara | H01L 27/0292 257/503 |
| 2013/0009278 A1* | 1/2013 | Lee | H01L 23/5252 257/530 |
| 2013/0026643 A1 | 1/2013 | England et al. | |
| 2013/0228867 A1* | 9/2013 | Suematsu | H01L 23/60 257/355 |
| 2014/0077369 A1 | 3/2014 | Liang et al. | |
| 2014/0082345 A1 | 3/2014 | Asano et al. | |
| 2014/0145266 A1* | 5/2014 | Ishikawa | H01L 27/0292 257/355 |
| 2014/0197526 A1 | 7/2014 | Yoo et al. | |
| 2015/0311094 A1 | 10/2015 | Whang et al. | |
| 2016/0225734 A1* | 8/2016 | Veches | H01L 24/17 |
| 2016/0247747 A1* | 8/2016 | Janzen | H01L 21/76898 |
| 2016/0254248 A1 | 9/2016 | Shih | |
| 2017/0025402 A1 | 1/2017 | Opoczynski et al. | |
| 2017/0033079 A1 | 2/2017 | Lin et al. | |
| 2017/0098631 A1 | 4/2017 | Kikuchi et al. | |
| 2017/0243858 A1* | 8/2017 | Chou | H01L 25/0657 |
| 2018/0076807 A1 | 3/2018 | Devarajan et al. | |
| 2018/0109251 A1 | 4/2018 | Djelassi et al. | |
| 2018/0294251 A1* | 10/2018 | Liu | H01L 25/18 |
| 2018/0315720 A1* | 11/2018 | Liao | H01L 25/16 |
| 2019/0148314 A1 | 5/2019 | Davis et al. | |
| 2019/0148342 A1 | 5/2019 | Hu et al. | |
| 2019/0148358 A1 | 5/2019 | Davis et al. | |
| 2019/0148359 A1 | 5/2019 | Davis et al. | |
| 2019/0273052 A1* | 9/2019 | Davis | H01L 24/95 |
| 2020/0035650 A1 | 1/2020 | Duesman et al. | |
| 2020/0152620 A1 | 5/2020 | Davis et al. | |

FOREIGN PATENT DOCUMENTS

| | | |
|---|---|---|
| KR | 20120017564 A | 2/2012 |
| TW | 200301010 A | 6/2003 |
| TW | 201714275 A | 4/2017 |

OTHER PUBLICATIONS

Davis et al., Unpublished U.S. Appl. No. 15/811,579; entitled: "Semiconductor Devices With Post-Probe Configurability", filed Nov. 13, 2017, 30 pages.

Davis et al., Unpublished U.S. Appl. No. 16/020,792; entitled: "Semiconductor Devices With Through Silicon Vias and Package-Level Configurability", filed Jun. 27, 2018, 31 pages.

International Application No. PCT/US2019/036696—International Search Report and Written Opinion, dated Sep. 27, 2019, 14 pages.

International Application No. PCT/US2018/050072—International Search Report and Written Opinion, dated Jan. 11, 2019, 11 pages.

TW Patent Application No. 107133099—Taiwanese Office Action and Search Report, dated Jul. 4, 2019, with English Translation, 11 pages.

International Application No. PCT/US2018/053862—International Search Report and Written Opinion, dated Mar. 11, 2019, 12 pages.

TW Patent Application No. 107136282—Taiwanese Office Action and Search Report, dated Oct. 4, 2019, with English Translation, 14 pages.

CN Patent Application No. 201980001899.X—Chinese Office Action and Search Report, dated Jun. 3, 2020, with English Translation, 16 pages.

TW Patent Application No. 108121889—Taiwanese Office Action and Search Report, dated Apr. 16, 2020 with English Translation, 21 pages.

* cited by examiner

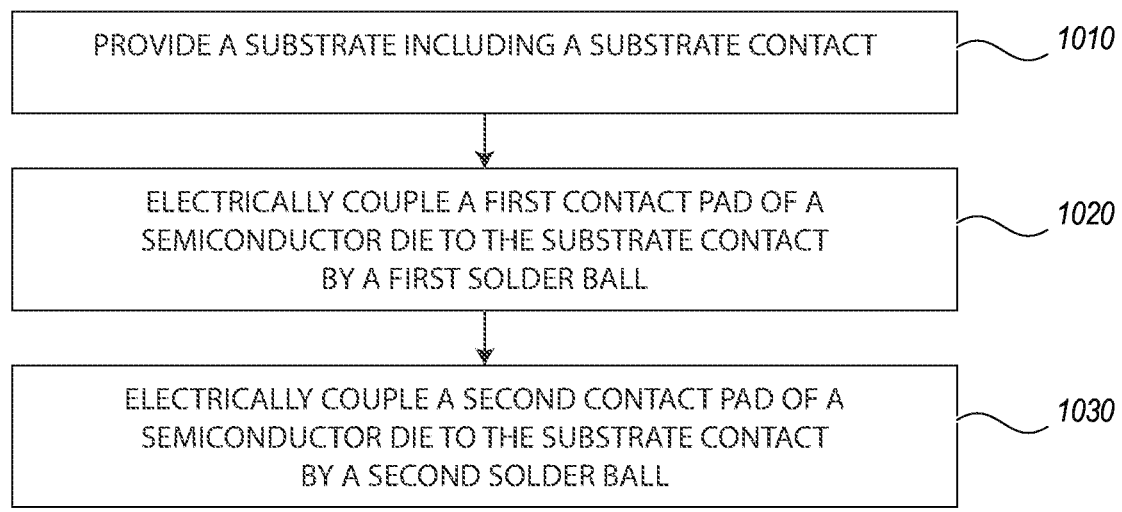

SEMICONDUCTOR DEVICES WITH PACKAGE-LEVEL CONFIGURABILITY

CROSS-REFERENCE TO RELATED APPLICATIONS

This application contains subject matter related to a previously-filed U.S. Patent Application by James E. Davis, Kevin G. Duesman, Jeffrey P. Wright, and Warren L. Boyer, entitled "SEMICONDUCTOR DEVICES WITH POST-PROBE CONFIGURABILITY". The related application, of which the disclosure is incorporated by reference herein, is assigned to Micron Technology, Inc., and was filed on Nov. 13, 2017 as U.S. patent application Ser. No. 15/811,579.

This application contains subject matter related to a previously-filed U.S. Patent Application by James E. Davis, John. B. Pusey, Zhiping Yin, and Kevin G. Duesman, entitled "SEMICONDUCTOR DEVICES WITH PACKAGE-LEVEL CONFIGURABILITY". The related application, of which the disclosure is incorporated by reference herein, is assigned to Micron Technology, Inc., and was filed on Nov. 13, 2017 as U.S. patent application Ser. No. 15/811,572.

This application contains subject matter related to a previously-filed U.S. Patent Application by Kevin G. Duesman, James E. Davis, and Warren L. Boyer, entitled "SEMICONDUCTOR DEVICES WITH THROUGH SILICON VIAS AND PACKAGE-LEVEL CONFIGURABILITY". The related application, of which the disclosure is incorporated by reference herein, is assigned to Micron Technology, Inc., and was filed on Jun. 27, 2018 as U.S. patent application Ser. No. 16/020,792.

TECHNICAL FIELD

The present disclosure generally relates to semiconductor devices, and more particularly relates to semiconductor devices with package-level configurability.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include active circuits (e.g., providing functional features such as memory cells, processor circuits, and/or imager devices) and/or passive features (e.g., capacitors, resistors, etc.) as well as bond pads electrically connected to the circuits. The bond pads can be electrically connected to terminals outside the protective covering to allow the die to be connected to higher level circuitry.

With some semiconductor dies, various bond pads can be connected to multiple circuits in a die. For example, FIG. 1 is a simplified schematic view of a semiconductor device 100, such as a NAND memory die, in which a single bond pad (e.g., bond pad 111 or 112) may be connected to both an active driver circuit and a passive ESD protection circuit (e.g., including one or more capacitors). The ESD protection circuit can be designed to provide a desired amount of capacitance to protect the single active driver circuit when incorporated into a semiconductor device package, such as that shown in a simplified schematic cross-sectional view in FIG. 2. Semiconductor device package 200 includes a semiconductor die 201, in which bond pads, such as bond pads 211 and 212, are each connected to both a driver circuit and an ESD protection circuit. Semiconductor die 201 is operably connected, by solder balls 230, to a package substrate 202, such that substrate contacts 221a and 222a are attached to corresponding ones of bond pads 211 and 212. In this fashion, package contacts 221b and 222b, on the bottom of the package substrate 202, can each be electrically connected to a driver and an ESD circuit. Depending upon the desired characteristics of the semiconductor device package in which a semiconductor die is included, however, different amounts of ESD protection may be desired. This can be addressed by designing different memory dies (e.g., of NAND or other memory formats) to accommodate the different desired package characteristics, but designing and fabricating multiple different semiconductor dies for each possible package configuration is prohibitively expensive. Accordingly, there is a need for a semiconductor die that can be configured with different amounts of ESD protection depending upon the configuration in which the die is packaged.

BRIEF DESCRIPTION OF THE DRAWINGS

FIG. 10 is a flow chart illustrating a method of making a semiconductor device in accordance with an embodiment of the present technology.

DETAILED DESCRIPTION

Figure 1:
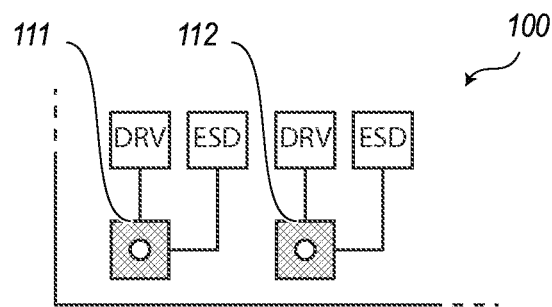
FIG. 1 is a simplified schematic view of a semiconductor device.
Figure 2:
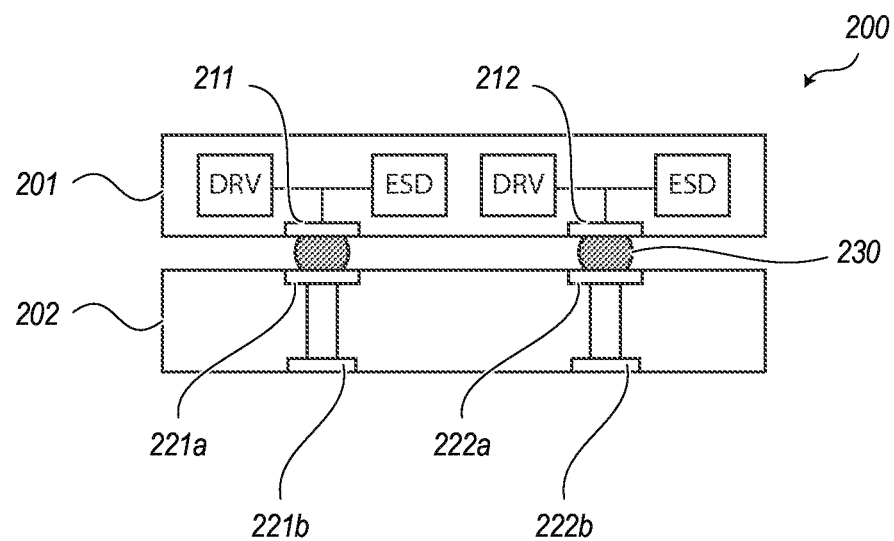
FIG. 2 is a simplified schematic cross-sectional view of a semiconductor device assembly.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, depending upon the desired characteristics of the semiconductor device package in which a semiconductor die is included, different amounts of ESD protection may be desired for a semiconductor die. Accordingly, several embodiments of semiconductor devices in accordance with the present technology can provide package-level configurability of a provided capacitance to overcome this challenge.

Several embodiments of the present technology are directed to semiconductor device assemblies includes a substrate and a die coupled to the substrate. The die includes a first contact pad electrically coupled to a first circuit on the die including at least one active circuit element and a second contact pad electrically coupled to a second circuit on the die including only passive circuit elements. The substrate includes a substrate contact electrically coupled to the first contact pad, and the substrate is electrically isolated from the second contact pad.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 3:
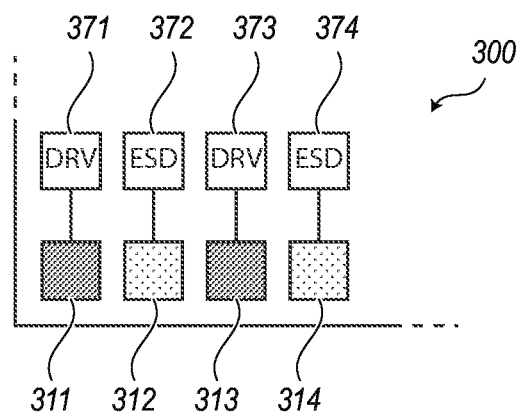
FIG. 3 is a simplified schematic view of a semiconductor device in accordance with an embodiment of the present technology.

FIG. 3 is a simplified schematic view of a semiconductor device 300 in accordance with an embodiment of the present technology. Semiconductor device 300 includes a plurality of contact pads, such as first through fourth contact pads 311-314, for providing connectivity to circuits in the semiconductor device 300. For example, the first contact pad 311 provides connectivity to a first circuit 371 with active components (e.g., a driver circuit), and the second contact pad 312 provides connectivity to a second circuit 372 with passive components (e.g., an ESD protection circuit). Similarly, the third contact pad 313 provides connectivity to a third circuit 373 with active components (e.g., a driver circuit), and the fourth contact pad 314 provides connectivity to a fourth circuit 374 with passive components (e.g., an ESD protection circuit). By providing each passive circuit with a dedicated contact pad, semiconductor device 300 makes possible different packaging configurations utilizing a single semiconductor die design, while providing a desired amount of ESD protection and without, e.g., excess capacitance causing the driver circuits 371 and 373 to consume excess power.

Figure 4:
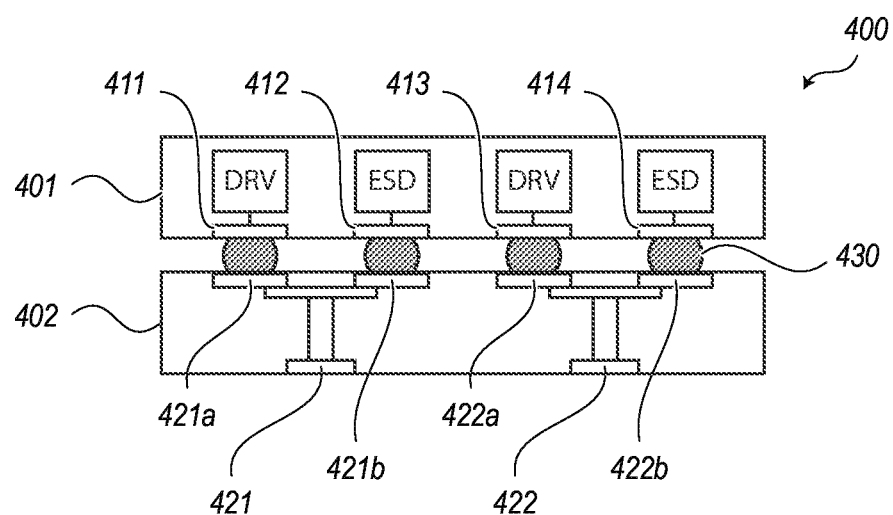
FIGS. 4 and 5 are simplified schematic cross-sectional views of semiconductor device assemblies in accordance with embodiments of the present technology.

This can be better understood with reference to FIG. 4, which is a simplified schematic view of a semiconductor device assembly 400 in accordance with an embodiment of the present technology. Assembly 400 includes a semiconductor die 401 attached to a substrate 402. Like the semiconductor device 300 illustrated in FIG. 3 above, semiconductor die 401 includes multiple contact pads, such as first through fourth contact pads 411-414, each providing connectivity to either a circuit with active components (e.g., a driver circuit) or a circuit with passive components (e.g., an ESD protection circuit). Because each ESD protection circuit of the semiconductor die 401 is provided with a dedicated contact pad (e.g., contact pads 412 and 414), the assembly 400 can be configured with a desired amount of ESD protection for each driver circuit.

As can be seen with reference to FIG. 4, the substrate 401 includes two substrate contacts 421 and 422. The first substrate contact 421 is connected (e.g., by metallization features in the substrate 402) to two substrate backside contacts 421a and 421b, and is further connected (e.g., by solder balls 430) to the first contact pad 411 (corresponding to a driver circuit) and the second contact pad 412 (corresponding to an ESD protection circuit) of the semiconductor die 401. Similarly, the second substrate contact 422 is connected (e.g., by metallization features in the substrate 401) to two substrate backside contacts 422a and 422b, and is further connected (e.g., by solder balls 430) to the third contact pad 413 (corresponding to a driver circuit) and the fourth contact pad 414 (corresponding to an ESD protection circuit) of the semiconductor die 401.

In another packaging configuration, the same semiconductor die design can be utilized, and can provide a different amount of ESD protection to a corresponding semiconductor package, by leaving electrically disconnected from the substrate contacts the contact pads that correspond to ESD protection circuits. This can be better understood with reference to FIG. 5, which is a simplified schematic view of a semiconductor device assembly 500 in accordance with an embodiment of the present technology. Assembly 500 includes a semiconductor die 501 attached to a substrate 502. Like the semiconductor die 401 illustrated in FIG. 4 above, semiconductor die 501 includes multiple contact pads, such as first through fourth contact pads 511-514, each providing connectivity to either a circuit with active components (e.g., a driver circuit) or a circuit with passive components (e.g., an ESD protection circuit). Because each ESD protection circuit of the semiconductor die 501 is provided with a dedicated contact pad (e.g., contact pads 512 and 514), the assembly 500 can be configured with a desired amount of ESD protection for each driver circuit by omitting solder balls between these contact pads and the substrate 502.

Figure 5:
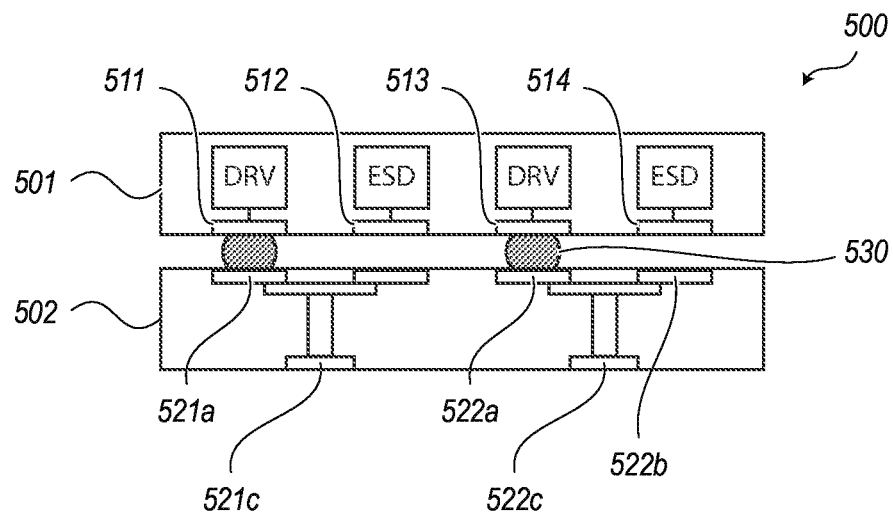

For example, as can be seen with reference to FIG. 5, the substrate 501 includes two substrate contacts 521 and 522. The first substrate contact 521 is connected (e.g., by metallization features in the substrate 502) to two substrate backside contacts 521a and 521b, and is further connected (e.g., by a solder ball 530) to only the first contact pad 511 (corresponding to a driver circuit) and not to the second contact pad 512 (corresponding to an ESD protection circuit) of the semiconductor die 501. Similarly, the second substrate contact 522 is connected (e.g., by metallization features in the substrate 501) to two substrate backside contacts 522a and 522b, and is further connected (e.g., by a solder ball 530) to the third contact pad 513 (corresponding to a driver circuit) and not to the fourth contact pad 514 (corresponding to an ESD protection circuit) of the semiconductor die 501. Accordingly, a single semiconductor die with dedicated bond pads for each ESD protection circuit can be utilized in different semiconductor package device designs with different ESD protection requirements by including or omitting solder balls that would provide electrical connection between the substrate contacts and the ESD protection circuits thereof.

Although FIGS. 4 and 5 have been described and illustrated as including semiconductor dies with two driver circuits, it will be readily apparent to those skilled in the art that this embodiment is but one example, and semiconductor dies with different numbers of driver circuits can also be provided. Furthermore, FIGS. 4 and 5 have been described and illustrated as providing contact pads for ESD protection circuits separate from contact pads for driver circuits, in other embodiments circuits with other active elements besides drivers can be provided, and other circuits including only passive components (e.g., resistors, capacitors, inductors, etc.) can likewise be provided.

Figure 6:
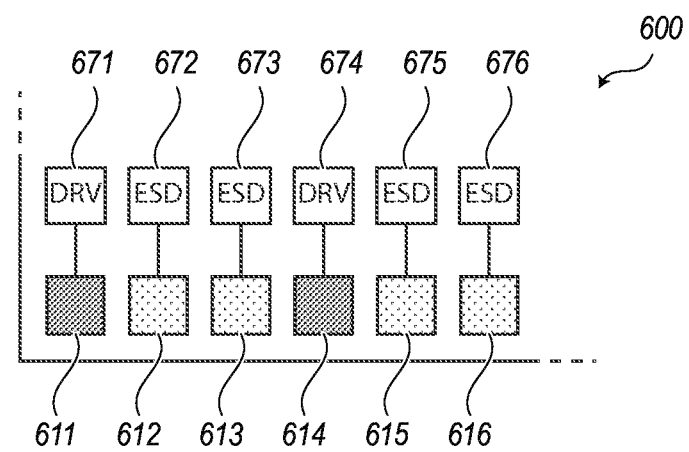
FIG. 6 is a simplified schematic view of a semiconductor device in accordance with an embodiment of the present technology.

Although in the foregoing examples semiconductor dies have been described and illustrated as including a single ESD protection circuit corresponding to each driver circuit, in other embodiments of the present technology, additional configurability can be provided by including multiple ESD protection circuits with dedicated contact pads corresponding to each driver circuit on a semiconductor die. For example, FIG. 6 is a simplified schematic view of a semiconductor device 600 in accordance with an embodiment of the present technology. Semiconductor device 600 includes a plurality of contact pads, such as first through sixth contact pads 611-616, for providing connectivity to circuits in the semiconductor device 600. For example, the first contact pad 611 provides connectivity to a first circuit 671 with active components (e.g., a driver circuit), and the second and third contact pads 612 and 613 provide connectivity to second and third circuits 672 and 673, respectively, which include only passive components (e.g., ESD protection circuits). Similarly, the fourth contact pad 614 provides connectivity to a fourth circuit 674 with active components (e.g., a driver circuit), and the fifth and sixth contact pads 615 and 616 provide connectivity to fifth and sixth circuits 675 and 676, respectively, which include only passive components (e.g., ESD protection circuits). By providing each active circuit with multiple corresponding passive circuits, each with their own dedicated contact pad, semiconductor device 600 makes possible different packaging configurations utilizing a single semiconductor die design, while providing a desired amount of ESD protection without, e.g., excess capacitance causing the driver circuits 671 and 674 to consume excess power.

Figure 7:
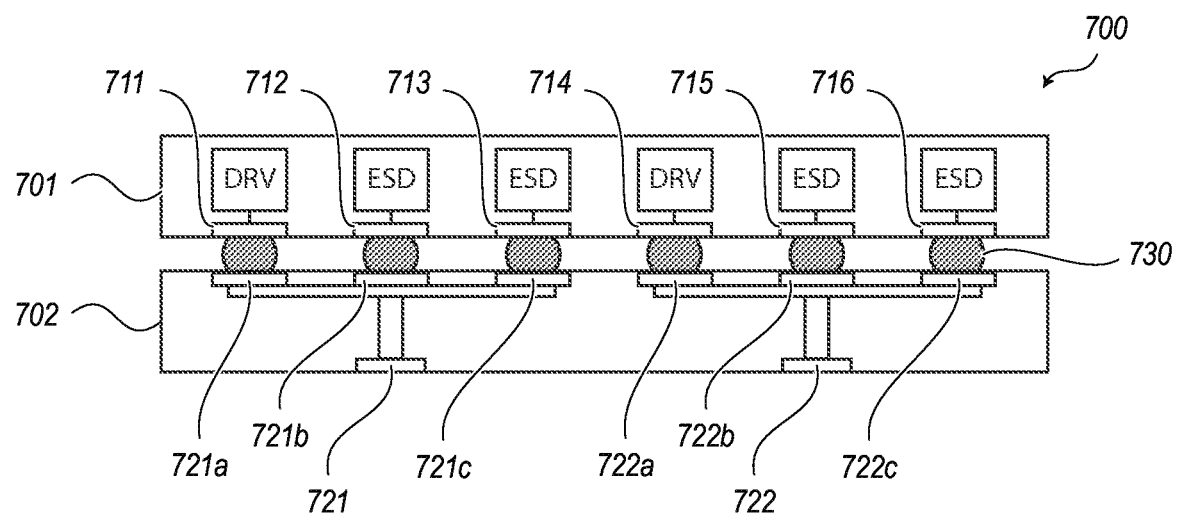
FIGS. 7 and 8 are simplified schematic views of semiconductor device assemblies in accordance with embodiments of the present technology.

This can be better understood with reference to FIG. 7, which is a simplified schematic view of a semiconductor device assembly 700 in accordance with an embodiment of the present technology. Assembly 700 includes a semiconductor die 701 attached to a substrate 702. Like the semiconductor device 300 illustrated in FIG. 3 above, semiconductor die 701 includes multiple contact pads, such as first through sixth contact pads 711-716, each providing connectivity to either a circuit with active components (e.g., a driver circuit) or a circuit with passive components (e.g., an ESD protection circuit). Because each ESD protection circuit of the semiconductor die 701 is provided with a dedicated contact pad (e.g., contact pads 712, 713, 715 and 716), the assembly 700 can be configured with a desired amount of ESD protection for each driver circuit.

As can be seen with reference to FIG. 7, the substrate 701 includes two substrate contacts 721 and 722. The first substrate contact 721 is connected (e.g., by metallization features in the substrate 702) to three substrate backside contacts 721a-721c, and is further connected (e.g., by solder balls 730) to the first contact pad 711 (corresponding to a driver circuit) and to the second and third contact pads 712 and 713 (corresponding to ESD protection circuits) of the semiconductor die 701. Similarly, the second substrate contact 722 is connected (e.g., by metallization features in the substrate 701) to three substrate backside contacts 722a-722c, and is further connected (e.g., by solder balls 730) to the fourth contact pad 714 (corresponding to a driver circuit) and to the fifth and sixth contact pads 715 and 716 (corresponding to ESD protection circuits) of the semiconductor die 701.

In another packaging configuration, the same semiconductor die design can be utilized, and can provide a different amount of ESD protection to a corresponding semiconductor package, by leaving electrically disconnected from the substrate contacts one or more of the contact pads that correspond to ESD protection circuits. This can be better understood with reference to FIG. 8, which is a simplified schematic view of a semiconductor device assembly 800 in accordance with an embodiment of the present technology. Assembly 800 includes a semiconductor die 801 attached to a substrate 802. Like the semiconductor die 701 illustrated in FIG. 7 above, semiconductor die 801 includes multiple contact pads, such as first through sixth contact pads 811-816, each providing connectivity to either a circuit with active components (e.g., a driver circuit) or a circuit with passive components (e.g., an ESD protection circuit). Because each ESD protection circuit of the semiconductor die 801 is provided with a dedicated contact pad (e.g., contact pads 812, 813, 815 and 816), the assembly 800 can be configured with a desired amount of ESD protection for each driver circuit by omitting solder balls between these contact pads and the substrate 802.

Figure 8:
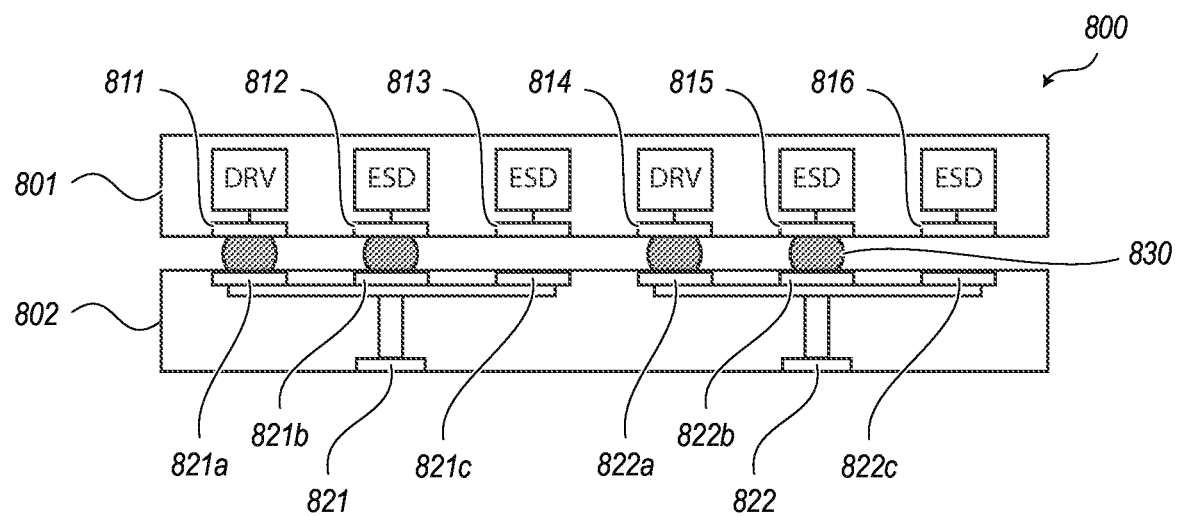

For example, as can be seen with reference to FIG. 8, the substrate 801 includes two substrate contacts 821 and 822. The first substrate contact 821 is connected (e.g., by metallization features in the substrate 802) to three substrate backside contacts 821a-821c, and is further connected (e.g., by solder balls 830) to the first contact pad 811 (corresponding to a driver circuit) and to the second contact pad 812 (corresponding to an ESD protection circuit) of the semiconductor die 801, but not to the third contact pad 813 (corresponding to another ESD protection circuit). Similarly, the second substrate contact 822 is connected (e.g., by metallization features in the substrate 801) to three substrate backside contacts 822a-822c, and is further connected (e.g., by a solder ball 830) to the fourth contact pad 814 (corresponding to a driver circuit) and to the fifth contact pad 815 (corresponding to an ESD protection circuit), but not to the sixth contact pad 816 (corresponding to another ESD protection circuit) of the semiconductor die 801. Accordingly, a single semiconductor die with dedicated bond pads for each ESD protection circuit can be utilized in different semiconductor package device designs with varying ESD protection requirements by including or omitting solder balls that would provide electrical connection between the substrate contacts and one or more of the ESD protection circuits thereof.

Figure 9:
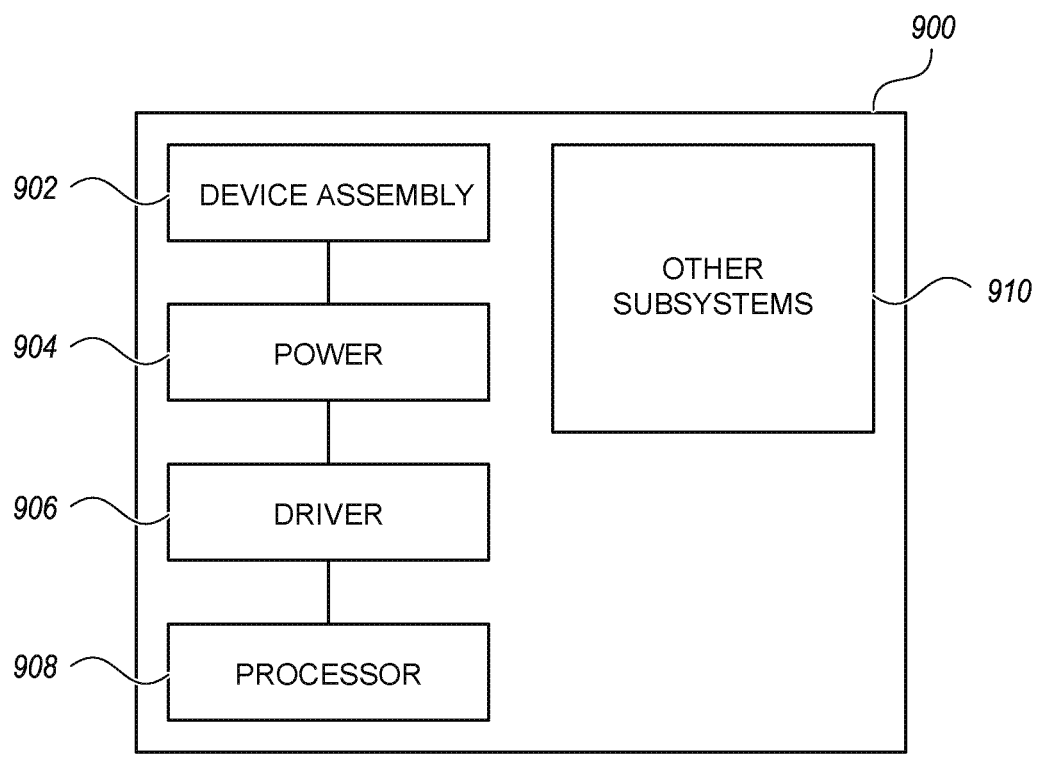
FIG. 9 is a schematic view showing a system that includes a semiconductor device assembly configured in accordance with an embodiment of the present technology.

Any one of the semiconductor device assemblies described above with reference to FIGS. 3-8 can be incorporated into any of a myriad of larger and/or more complex systems, a representative example of which is system 900 shown schematically in FIG. 9. The system 900 can include a semiconductor device assembly 902, a power source 904, a driver 906, a processor 908, and/or other subsystems or components 910. The semiconductor device assembly 902 can include features generally similar to those of the semiconductor devices described above with reference to FIGS. 3-8. The resulting system 900 can perform any of a wide variety of functions, such as memory storage, data processing, and/or other suitable functions. Accordingly, representative systems 900 can include, without limitation, handheld devices (e.g., mobile phones, tablets, digital readers, and digital audio players), computers, vehicles, appliances and other products. Components of the system 900 may be housed in a single unit or distributed over multiple, interconnected units (e.g., through a communications network). The components of the system 900 can also include remote devices and any of a wide variety of computer readable media.

FIG. 10 is a flow chart illustrating a method of making a semiconductor device assembly. The method includes providing a substrate including a substrate contact (box 1010), and electrically coupling a first contact pad of a semiconductor die to the substrate contact by a first solder ball (box 1020). The first contact pad is electrically coupled to a first circuit on the semiconductor die including at least one active circuit element. The method further includes electrically coupling a second contact pad of the semiconductor die to the substrate contact by a second solder ball (box 1030). The second contact pad is electrically coupled to a second circuit on the semiconductor die including only passive circuit elements.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A semiconductor device assembly, comprising:
a substrate; and
a die coupled to the substrate, the die including:
a first contact pad electrically coupled to a first circuit on the die including at least one active circuit element, and
a second contact pad electrically coupled to a second circuit on the die including only passive circuit elements;
wherein the substrate includes a substrate contact electrically coupled to the first contact pad,
wherein the substrate is electrically isolated from the second contact pad, and
wherein the semiconductor device assembly includes no semiconductor dies other than the die.

2. The semiconductor device assembly of claim 1, wherein the first circuit is a driver circuit.

3. The semiconductor device assembly of claim 1, wherein the second circuit includes one or more capacitors to provide electrostatic discharge (ESD) protection.

4. The semiconductor device assembly of claim 1, wherein the substrate contact is electrically coupled to the first contact pad by a solder ball.

5. The semiconductor device assembly of claim 1, wherein the first contact pad is facing the substrate.

6. The semiconductor device assembly of claim 1, wherein:
the die further includes a third contact pad electrically coupled to a third circuit on the die including only passive circuit elements, and
the substrate contact is electrically coupled to the third contact pad.

7. The semiconductor device assembly of claim 6, wherein the third circuit includes one or more capacitors to provide electrostatic discharge (ESD) protection.

8. The semiconductor device assembly of claim 1, wherein the die is a NAND memory die.

9. A semiconductor device assembly, comprising:
a substrate; and
a die coupled to the substrate, the die including:
a first contact pad electrically coupled to a first circuit on the die including at least one active circuit element,
a second contact pad electrically coupled to a second circuit on the die including only passive circuit elements, and
a third contact pad electrically coupled to a third circuit on the die including only passive circuit elements;
wherein the substrate includes a substrate contact electrically coupled to the first contact pad by a first solder ball and to the second contact pad by a second solder ball, and
wherein the semiconductor device assembly includes no semiconductor dies other than the die.

10. The semiconductor device assembly of claim 9, wherein the substrate is electrically isolated from the third contact pad.

11. The semiconductor device assembly of claim 9, wherein the substrate is electrically coupled to the third contact pad by a third solder ball.

12. The semiconductor device assembly of claim 9, wherein the first circuit is a driver circuit.

13. The semiconductor device assembly of claim 9, wherein the second circuit includes one or more capacitors to provide electrostatic discharge (ESD) protection.

14. The semiconductor device assembly of claim 9, wherein the third circuit includes one or more capacitors to provide electrostatic discharge (ESD) protection.

15. The semiconductor device assembly of claim 9, wherein the first contact pad is facing the substrate.

16. The semiconductor device assembly of claim 9, wherein the die is a NAND memory die.

17. A method of making a semiconductor device assembly, comprising:
providing a substrate including a substrate contact;
electrically coupling a first contact pad of a semiconductor die to the substrate contact by a first solder ball, wherein the first contact pad is electrically coupled to a first circuit on the semiconductor die including at least one active circuit element, and
electrically coupling a second contact pad of the semiconductor die to the substrate contact by a second solder ball, wherein the second contact pad is electrically coupled to a second circuit on the semiconductor die including only passive circuit elements,
wherein the semiconductor device assembly includes no semiconductor dies other than the semiconductor die.

18. The method of claim 17, wherein the first circuit is a driver circuit.

19. The method of claim 17, wherein the second circuit includes one or more capacitors to provide electrostatic discharge (ESD) protection.

* * * * *